(12) United States Patent
Delhougne et al.

(10) Patent No.: US 8,330,138 B2
(45) Date of Patent: Dec. 11, 2012

(54) ELECTRONIC DEVICE COMPRISING A CONVERTIBLE STRUCTURE, AND A METHOD OF MANUFACTURING AN ELECTRONIC DEVICE

(75) Inventors: Romain Delhougne, Aarschot (BE); Michael Zandt, Veldhoven (NL)

(73) Assignee: NXP B.V. (NL)

( * ) Notice: Subject to any disclaimer, the term of this patent is extended or adjusted under 35 U.S.C. 154(b) by 302 days.

(21) Appl. No.: 12/598,966

(22) PCT Filed: May 28, 2008

(86) PCT No.: PCT/IB2008/052087
§ 371 (c)(1),
(2), (4) Date: Nov. 5, 2009

(87) PCT Pub. No.: WO2008/146243
PCT Pub. Date: Dec. 4, 2008

(65) Prior Publication Data
US 2010/0084626 A1    Apr. 8, 2010

(30) Foreign Application Priority Data
May 31, 2007   (EP) .................................. 07109334

(51) Int. Cl.
*H01L 45/00* (2006.01)

(52) U.S. Cl. ... 257/4; 257/1; 257/7; 257/8; 257/E31.029; 257/E45.002; 438/95; 438/102; 438/103

(58) Field of Classification Search ................. 257/1, 4, 257/7, 8, E31.029, E21.158, E45.002; 438/95, 438/102, 103
See application file for complete search history.

(56) References Cited

U.S. PATENT DOCUMENTS

| | | |
|---|---|---|
| 2002/0127844 A1 | 9/2002 | Grill et al. |
| 2004/0127001 A1 | 7/2004 | Colburn et al. |
| 2004/0164290 A1 | 8/2004 | Yi et al. |
| 2005/0145984 A1 | 7/2005 | Chen et al. |
| 2007/0108077 A1 | 5/2007 | Lung et al. |

FOREIGN PATENT DOCUMENTS

| | | |
|---|---|---|
| WO | 2005/093839 A2 | 10/2005 |
| WO | 2007/110815 A | 10/2007 |

*Primary Examiner* — Ha Tran T Nguyen
*Assistant Examiner* — Suberr Chi

(57) ABSTRACT

An electronic device (100), the electronic device (100) comprises a substrate (101), a first electrode (102) formed at least partially on the substrate (101), a second electrode (103) formed at least partially on the substrate (101), a convertible structure (104) connected between the first electrode (102) and the second electrode (103), and a spacer element (105) connected between the first electrode (102) and the second electrode (103) and adapted for spacing the convertible structure (104) with regard to a surface of the substrate (101).

24 Claims, 4 Drawing Sheets

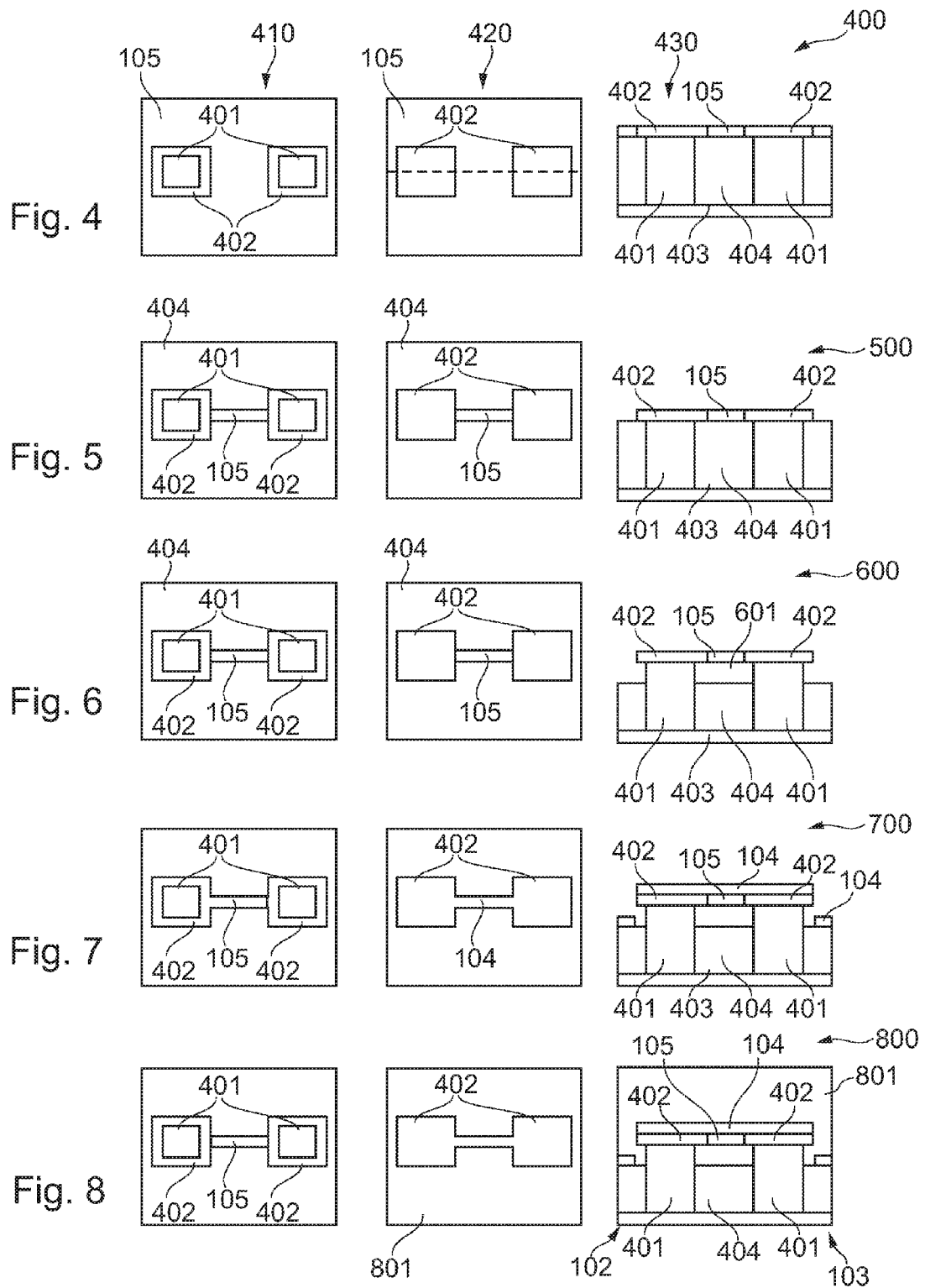

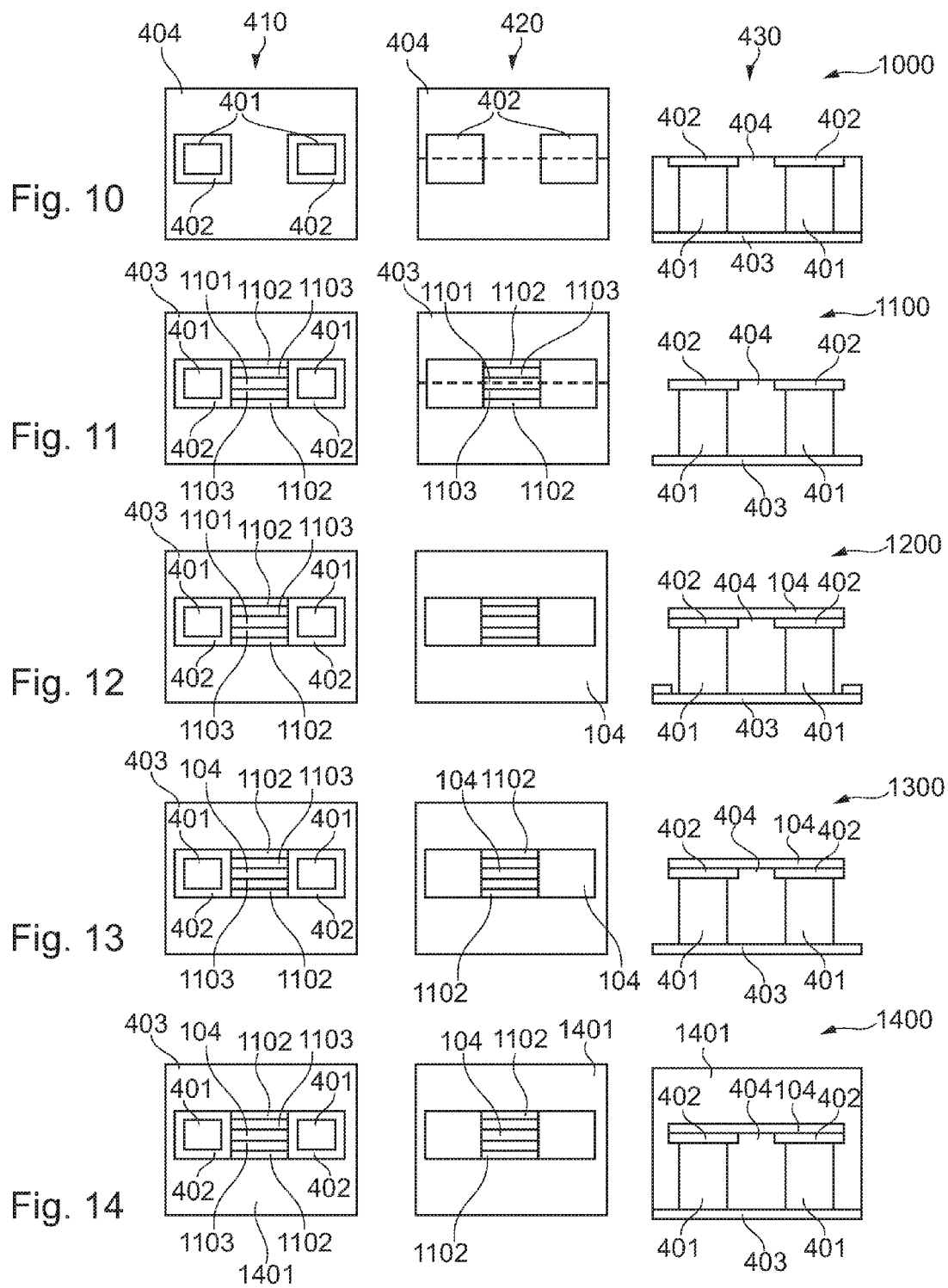

ELECTRONIC DEVICE COMPRISING A CONVERTIBLE STRUCTURE, AND A METHOD OF MANUFACTURING AN ELECTRONIC DEVICE

FIELD OF THE INVENTION

The invention relates to an electronic device comprising a convertible structure. Moreover, the invention relates to a method of manufacturing an electronic device that comprises a convertible structure.

BACKGROUND OF THE INVENTION

In the field of non-volatile memories, flash memory scaling beyond a 45 nm node has become a real issue. Technologies to face this challenge are ferroelectric, magnetic and phase change memories, the latter one being promising for the replacement of flash and showing characteristics that may allow replacement of other types of memories such as DRAM. Phase change memories are a possible solution for the unified memory being an important step in the electronics art. OTP ("on time programmable") and MTP ("multiple times programmable") memories open a field that may present a great opportunity for phase change memories as well.

Phase change memories are based on a reversible memory switching using, for instance, chalcogenide materials. The ability of these materials to undergo fast phase transition has led to the development of rewritable optical media (CD, DVD). The chalcogenide phase change materials may be divided in two classes, which are slightly different compositions, based on their crystallization mechanism. One class is the so-termed "nucleation dominated" material GeTe—$Sb_2Te_3$ tie line such as $Ge_2Sb_2Te_5$, which may be used in ovonic unified memory (OUM) devices. In this concept, the phase change material may be in contact with a bottom-resistive electrode to switch reversibly to a small volume of phase change material. The other class is "fast growth material", known in optical storage application (CD-RW/DVD+RW), which enables very fast switching (for instance 10 ns) with a proper phase stability.

Thus, phase change materials may be used for storing information. The operational principle of these materials is a change of phase. In a crystalline phase, the material structure is—and thus properties are—different from the properties in the amorphous phase.

The programming of a phase change material is based on the difference between the resistivity of the material and its amorphous and crystalline phase. To switch between both phases, an increase of the temperature is required. Very high temperatures with rapid cooling down will result in an amorphous phase, whereas a smaller increase in temperature or slower cooling down leads to a crystalline phase. Sensing the different resistances may be done with a small current that does not cause substantial heating.

The increase in temperature may be obtained by applying a pulse to the memory cell. A high current density caused by the pulse may lead to a local temperature increase. Depending on the duration and amplitude of the pulse, the resulting phase will be different. A fast cooling and large amplitude may quench the cell in an amorphous phase, whereas a slow cooling down and a smaller amplitude pulse may allow the material to crystallize. Larger pulse amplitudes, so-called RESET pulses, may amorphize the cells, whereas smaller pulse amplitudes will SET the cell to its crystalline state, these pulses are also called SET pulses.

WO 2005/093839 discloses an electric device having a resistor comprising a layer of a phase change material, which is changeable between a first phase with a first electrical resistance and a second phase with a second electrical resistance different from the first electrical resistance. The phase change material is a fast growth material. The electric device further comprises a switching signal generator for switching the resistor between at least three different electrical resistance values by changing a corresponding portion of the layer of the phase change material from the first phase to the second phase However, when manufacturing conventional phase change material memory cells, it may be difficult to obtain a proper and reproducible quality of the manufactured memory cells.

OBJECT AND SUMMARY OF THE INVENTION

It is an object of the invention to provide an electronic device, which can be manufactured with a proper and reproducible quality.

In order to achieve the object defined above, an electronic device and a method of manufacturing an electronic device according to the independent claims are provided.

According to an exemplary embodiment of the invention, an electronic device is provided, the electronic device comprising a substrate, a first electrode formed at least partially on the substrate, a second electrode formed at least partially on the substrate, a convertible structure connected between the first electrode and the second electrode, and a spacer element connected between the first electrode and the second electrode and adapted for spacing the convertible structure with regard to a surface of the substrate.

According to another exemplary embodiment of the invention, a method of manufacturing an electronic device is provided, the method comprising forming a first electrode at least partially on a substrate, forming a second electrode at least partially on the substrate, connecting a convertible structure between the first electrode and the second electrode, and connecting a spacer element between the first electrode and the second electrode for spacing the convertible structure with regard to a surface of the substrate.

The term "electronic device" may particularly denote any component, member or apparatus that fulfills any electric, magnetic and/or electronic functionality. This means that electric, magnetic and/or electromagnetic signals may be applied to and/or generated by the electronic device during regular use.

The term "convertible structure" may particularly denote any physical structure having convertible properties. Examples are a phase change structure or another structure with thermo-dependent properties. Phase change materials can have not only two phases but also more than two phases, for instance crystalline, amorphous, meta-amorphous, meta-crystalline, crystalline with a different lattice orientation, etc.

The term "phase change structure" may particularly denote any physical structure that has the property to change any physical parameter or material property under the influence of heat (generated by ohmic losses of an electric current flowing through the phase change structure or an electrically/a thermally coupled heating element, and/or generated by the absorption of electromagnetic radiation). This may particularly mean a switch of a material such as a chalcogenide between an amorphous configuration and a crystalline configuration, which may be accompanied by a significant change in the electrical resistivity. However, any other phase changes such as a change from a solid to a liquid phase, which phase changes are connected with a change of a physical property, may be covered by this term.

The term "memory cell" may particularly denote a physical structure (such as a layer sequence, for instance monolithically integrated in a substrate such as a silicon substrate) that allows storing information in an electronic manner. An amount of information stored in a memory cell may be 1 bit (particularly when the phase change material is switched between two phases representing logical values "1" or "0") or may be more than 1 bit (particularly when the phase change material is switched between at least three phases). The memory cell may be formed on and/or in a substrate, which may denote any suitable material, such as a semiconductor, glass, plastic, etc.

The term "substrate" may be used to define generally the elements for layers that underlie and/or overlie a layer or portions of interest. Also, the substrate may be any other base on which a layer is formed, for example a semiconductor wafer such as a silicon wafer or silicon chip.

The term "spacer element" may particularly denote any structure which maintains a predefined distance between a substrate and a convertible structure, thereby allowing to deposit the convertible structure on the spacer element without generating a continuous layer short circuiting the substrate with electrodes.

According to an exemplary embodiment of the invention, a spacer element is formed between two electrodes to serve as a support or underlay or template for a subsequent formation of a convertible structure such as a phase change material. By taking this measure, a convertible structure may be formed with any desired shape, dimension and position without performing a complex and time consuming patterning procedure, which may also deteriorate the properties of the convertible structure. In contrast to this, according to an exemplary embodiment of the invention, when depositing material of the convertible structure over an entire surface of a layer sequence, a raised topography of the electrodes including the spacer element in between ensures that a spatially limited portion on top of the electrodes is contiguously covered with the convertible structure (electrically coupled between the electrodes). Therefore, the convertible structure may be formed in a self-aligned manner without the need to define spatial limitations of the convertible structure using lithography and etching procedures. This allows to form electronic components including phase change material structures in a simple way and to ensure a reliable and constant quality and material properties of the convertible structure. Therefore, at an elevated level, the convertible structure may be deposited, so that a simultaneous deposition of such a material on a surface of the substrate does not influence the electronic properties of the two electrodes connected with phase change material, due to the electric decoupling of the used (top) and the non-used (bottom) portions of the phase change material.

According to an exemplary embodiment of the invention, a method of forming a memory cell is provided, the method comprising forming at least two (for instance metallic) electrodes on a substrate, forming a dielectric element (for instance a free hanging bridge or a wall) linking the two electrodes, the electrodes and the dielectric element rising substantially from the substrate, and depositing phase change material over the dielectric element and electrodes. By taking this measure, a self-aligned process may be provided to form a line cell phase change memory. No direct patterning of the active part of the phase change material is necessary, and no modification of the properties of the phase change material occurs due to patterning.

Therefore, a method for producing a phase change memory may be provided comprising etching a dielectric layer, creating a dielectric bridge between two metal contacts, depositing phase change material on the bridge, and optionally protecting the phase change material layer with a protective coating.

According to an exemplary embodiment, a fast growth phase change line may be fabricated, by patterning first a supportive dielectric bridge between two electrodes. The phase change material may then be deposited in a self-aligning manner to form a line connected to both electrodes. The dielectric bridge may be used only as a supportive element for the self-aligned process. The bridge may be provided as an insulator to avoid any electric function of the bridge.

According to an exemplary embodiment, a self-aligned phase change line memory is provided. Phase change memory technology is a promising non-volatile semiconductor memory technology for stand alone and embedded applications. In a "line cell" concept according to an exemplary embodiment, the active part of the memory device is a line of phase change material. In conventional approaches, this line may be formed by directly patterning a deposited layer of phase change material. Such a patterning procedure is difficult to control due to the high reactivity of the phase change material so that the properties of the phase change material can be strongly altered by the etch chemistry. This may lead to poor memory devices. In contrast to these conventional approaches, exemplary embodiments of the invention provide a method for making self-aligned line cell phase change memories in which no direct patterning of the active part of the memory device is needed. This may guarantee that the phase change material properties remain unchanged during the memory fabrication, leading to a better memory performance.

According to an exemplary embodiment, a method of forming a self-aligned phase change line cell memory is provided, where no direct patterning of the active part of the memory cell is needed. The structure and composition of the phase change material remains intact, ensuring that defined properties of the active material of the memory device can be guaranteed.

Therefore, a self-aligned process to form a line cell phase change memory may be provided. No direct patterning of the active part of the phase change material is necessary. No modification of the properties of the phase change material occurs due to the patterning. A dielectric element (such as a free hanging bridge or a wall) may be patterned between two electrodes, and may serve as a support for the phase change line. The dielectric supportive element dimensions may determine line cell dimensions. Standard CMOS processing may be implemented, and the manufacturing method is easily integratable into standard processing apparatuses.

Exemplary applications of exemplary embodiments of the invention are any kind of phase change memories, BEOL metallic fuse technologies (one time programmable memories). Furthermore, nanowire formation may be integrated in a manufacturing procedure according to exemplary embodiments of the invention.

Next, further exemplary embodiments of the electronic device will be explained. However, these embodiments also apply to the method of manufacturing an electronic device.

The spacer element may comprise a dielectric material. By manufacturing the spacer element from an electrically non-conductive material, any undesired electric current flow through the spacer element may be prevented so that the spacer element is formed to provide only a mechanical spacing function and a template function, not an electrical function. According to other embodiments, the spacer element may also contribute to the electric function of the electronic device, and may simultaneously fulfill its support and template function. Exemplary materials for such dielectric structures are silicon oxide, silicon nitride, and silicon carbide.

The first electrode and/or the second electrode may consist of exactly one electrically conductive material. By forming the electrodes of a single metallic material, the manufacturing process may be kept simple, thereby promoting a low cost manufacturability of the electronic device.

Alternatively, the first electrode and/or the second electrode may comprise a first electrically conductive material being in direct contact with the convertible structure, and may comprise a second electrically conductive material out of direct contact with the convertible structure. In such a scenario, the first electrically conductive material may be configured to be chemically compatible to the contacted phase change material. In contrast to this, the second electrically conductive material which is not in direct contact with the phase change material can be optimized regarding electrical properties such as resistivity, without considering any chemical requirement for a proper match between the material of the electrode and the material of the phase change material. Exemplary materials which do not react with phase change materials are TiN, TaN, W, TiW. An exemplary material which does react with phase change materials is Cu.

A support structure may be provided between the substrate and the spacer element. Such a support structure may be a sacrificial structure which can be removed after depositing the spacer element on the support structure. The support structure and the spacer element may be made from different materials so that selective removal of one of the support structure and the spacer element is possible without influencing the other one of the support structure and the spacer element.

The support structure and the spacer element may be made from different materials. The support structure may again made of a dielectric material, so as to be neutral regarding the electrical function of the electronic device.

A protective structure (such as a passivation layer) may be formed to cover at least the convertible structure, thereby shielding the sensitive phase change material layer with respect to an environment.

The spacer element may be adapted as a template on which the convertible structure is formed. In other words, a geometry of a surface area of the spacer element may serve as an elevated structure on which subsequently the functionally active convertible structure is formed, for instance by deposition, so that any patterning procedure becomes obsolete. In a plan view on the surface of the substrate (that is when looking perpendicularly on a main surface of the substrate, on which main surface the processing is performed to establish the electronic device), an outline (such as a contour or a perimeter) of an arrangement formed by the spacer element, the first electrode and the second electrode may essentially equal to an outline of the convertible structure.

The convertible structure may form a thermo-dependent structure, particularly a phase change structure which is convertible between at least two phase states. Thus, under the influence of heat which may be generated by ohmic losses of a programming current flowing through the phase change structure and/or electrodes connected thereto, the switch between the two phases can be initiated. Thermal energy may also be supplied via electromagnetic radiation.

Particularly, the phase change structure may be adapted such that a value of the electrical conductivity differs between the two phase states. In one of the at least two phase states, the phase change structure may be electrically conductive (for instance essentially metallically conductive). In the other phase state, the electrical conductivity may be larger or lower than in the first state, for instance the phase change structure may be superconductive or may be semiconductive or may be isolating or may be conductive as well with a modified value of conductivity. In a normal operation of the electronic component, the function of the electronic device will be influenced, will be defined or will depend on the present value of the electrical conductivity of the phase change structure. This may allow to manufacture memory cells, switches, actuators, sensors, etc. using the different value of the electrical conductivity of the phase change structure in the different phase modes.

A current pulse or a current signal may generate heat (thermal energy) in a convertible material to thereby change its phase state and consequently its value of the electrical conductivity. The applied current pulses may have a certain shape (for instance may have a fast raising edge and a slow falling edge, or may have a raising edge which is curved to the right and a falling edge which is curved to the left) and may be characterized by different parameters (such as current amplitude, pulse duration, etc.). By adjusting the pulse parameters, it is possible to control whether the phase change material is converted into a crystalline phase or is converted into an amorphous phase. Very high temperatures with rapid cooling down may result in an amorphous phase. A smaller increase in temperature or slower cooling down may lead to a crystalline phase.

The phase change structure may be adapted such that one of the two phase states relates to a crystalline phase and the other one of the two phase states relates to an amorphous phase of the phase change structure. Such a material property can be found in chalcogenide materials. A chalcogenide glass may be used which is a glass containing a chalcogenide element (sulphur, selenium or tellurium) as a substantial constituent. Examples for phase change materials are GeSbTe, AgInSbTe, InSe, SbSe, SbTe, InSbSe, InSbTe, GeSbSe, GeSbTeSe or AgInSbSeTe.

The electronic component may comprise an electric sensing circuitry adapted for sensing the different electrical properties of the convertible structure in different ones of the at least two states. For instance, a test voltage may be applied to the convertible structure, and a current flowing along the convertible structure will depend on the phase state of the convertible structure, since the electrical conductivity is different in the crystalline and in the amorphous phase. Such a sensing circuitry may also include selection transistors or other kinds of switches, which selectively enable or disable access to a particular electronic component of an array of electronic components. Thus, a respective selection transistor may be assigned to each one of the electronic components.

The electronic device may be adapted as a memory device. In such a memory device, the information of one or more bits may be stored in the present phase of the phase change material, particularly depending on the present one of two or more phase states of the phase change structure.

The electronic device may also be adapted as a memory array, that is a configuration of a (large) plurality of memory devices of the aforementioned type. In such a memory array, the memory cells may be arranged in a matrix-like manner and may be controlled via bit lines and word lines with transistors serving as switches to get or prevent access to desired individual memory cells and memory devices. The multiple memory cells may be monolithically integrated in a common (for instance silicon) substrate.

The electronic component may also serve as an actuator, since a change of the electrical conductivity of the phase change structure may result in a modification of an actuation signal.

It is also possible to adapt the electronic component as a microelectromechanical structure (MEMS). An electrical signal modified by a phase change of the convertible material may result in a specific motion of a movable component of the microelectromechanical structure (MEMS).

It is clear that the modification of the phase change material, and therefore of its electrical conductivity, may be used to construct controllers, switches, transductors, etc.

In the following, further exemplary embodiments of the method of manufacturing an electronic device will be explained. However, these embodiments also apply to the electronic device.

The spacer element may be formed to provide for a self-aligned connection of the convertible structure between the first electrode and the second electrode. By providing the spacer element as a bridging or connection structure between the two electrodes, and by forming the convertible structure on the spacer element, the position of the convertible structure is automatically correct (even when the material of the convertible structure is deposited non-selectively on the entire surface of the substrate/wafer), so that no alignment problems occur. This allows for a spatially accurate and simple manufacture of the component, and prevents any misalignment problems, thereby ensuring a proper quality.

The convertible structure may be formed without patterning. No lithography and etching procedure is required for a generation of the convertible structure. In contrast to this, the spacer element serves as an elevated template for manufacturing the convertible structure on top of it.

The spacer element may be formed as a free hanging bridge between the first electrode and the second electrode and may be arranged above the substrate (with a gap in between). Thus, the portion between a lower surface of the spacer element and an upper surface of the substrate may be free of any material, thereby promoting the free deposition of phase change material on top of the spacer element without the danger that there will be an electrically conductive connection of phase change material bridging and thus electrically coupling a top of the spacer element to a top of the substrate.

The spacer element may, alternatively, be formed as a bridging wall between the first electrode and the second electrode and may be located above the substrate (but in contact with the substrate). The term "wall" may denote a structure having a relatively thin thickness and a large length and height, such as the wall of a house. When such a bridging wall is provided to connect the two electrodes, subsequent deposition of phase change material does not involve the danger that lateral walls of the wall element are also covered unintentionally with phase change material. This can particularly be achieved when the wall has a large aspect ratio, particularly an aspect ratio larger than 8.

The method may further comprise forming at least one auxiliary structure (for instance two auxiliary structures, for example two auxiliary walls, positioned to the left and to the right hand side of the wall) adjacent the spacer element such that a trench is formed between the at least one auxiliary structure and the spacer element. With the formation of a trench, particularly of a trench having an aspect ratio of at least 5, particularly of at least 8, it may be prevented that subsequently deposited material of the phase change structure remains in the trench or at walls of the auxiliary structure.

The electronic device may be formed in CMOS technology. CMOS technology is a widely-used technology and may ensure that the processing according to exemplary embodiments of the invention does not involve exotic and difficult procedures which are not compatible with CMOS. Thus, implementation of CMOS technology in the process scheme allows manufacturing the device with low costs. However, as an alternative to CMOS, other process technologies such as BIPOLAR, BICMOS, etc., may be implemented as well.

According to an exemplary embodiment of the invention, the method may further comprise forming a support structure on the substrate before forming the spacer element on the support structure. Furthermore, it is possible to at least partially remove the support structure (which may be denoted as a sacrificial structure) before forming the convertible structure on the spacer element. By taking this measure, it may be ensured that the phase change material is formed at an elevated level, therefore reliably decoupled electrically from the substrate.

For any method step, any conventional procedure as known from semiconductor technology may be implemented. Forming layers or components may include deposition techniques like CVD (chemical vapour deposition), PECVD (plasma enhanced chemical vapour deposition), ALD (atomic layer deposition), or sputtering. Removing layers or components may include etching techniques like wet etching, vapour etching, etc., as well as patterning techniques like optical lithography, UV lithography, electron beam lithography, etc.

Embodiments of the invention are not bound to specific materials, so that many different materials may be used. For conductive structures, it may be possible to use metallization structures, silicide structures or polysilicon structures. For semiconductor regions or components, crystalline silicon may be used. For insulating portions, silicon oxide or silicon nitride may be used.

The structure may be formed on a purely crystalline silicon wafer or on an SOI wafer (Silicon On Insulator).

The aspects defined above and further aspects of the invention are apparent from the examples of embodiment to be described hereinafter and are explained with reference to these examples of embodiment.

BRIEF DESCRIPTION OF THE DRAWINGS

The invention will be described in more detail hereinafter with reference to examples of embodiment but to which the invention is not limited.

FIG. 4 to FIG. 8 show layer sequences during a method of manufacturing an electronic device according to an exemplary embodiment of the invention.

FIG. 10 to FIG. 14 are layer sequences during a method of manufacturing an electronic device according to an exemplary embodiment of the invention.

DESCRIPTION OF EMBODIMENTS

Figure 1:
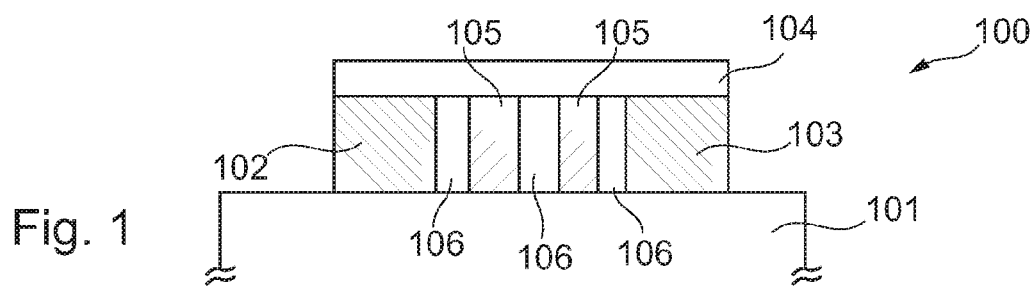
FIG. 1 illustrates an electronic memory cell device according to an exemplary embodiment of the invention.

The illustration in the drawing is schematical. In different drawings, similar or identical elements are provided with the same reference signs.

In the following, referring to FIG. 1, an electronic device 100 according to an exemplary embodiment of the invention will be explained.

The electronic device 100 comprises a silicon substrate 101, a first metal electrode 102 formed on the semiconductor substrate 101, a second metal electrode 103 formed on the silicon substrate 101, a phase change material structure 104 connected between the first electrode 102 and the second electrode 103 at an elevated level with respect to the silicon substrate 101, and a spacer element 105 made of a dielectric material and connected between the first electrode 102 and the second electrode 103 for spacing the phase change material structure 104 with regard to a surface of the substrate 101.

For programming the memory cell 100, a sufficiently large current is applied between the electrodes 102, 103 with an appropriately selected pulse designed to selectively switch the phase change structure 104 between a crystalline and an amorphous state. In the different states, the electrical conductivity of the phase change material 104 is significantly different, so that applying a sensing current between the electrodes 102, 103 allows to detect a voltage which depends on the present phase state. In the value of the detected voltage, the logic information "1" or "0" may be encoded, in accordance with a high ohmic resistance or a low ohmic resistance.

In an array of memory cells (not shown in the figure), a plurality of memory cells 100 may be arranged and may be addressable via word lines and bit lines, wherein access transistors (not shown) may be provided which allow the selective access to each individual memory cell 100 of such an array.

In FIG. 1, the spacer element 105 is formed by two pillars or posts made of a dielectric material. The electrodes 102, 103 are both made of the same material and can therefore be formed by a common deposition procedure, followed by lithography and etching.

Since the posts 105 define trenches 106 of such a high aspect ratio that deposition of phase change material on a layer sequence consisting of the substrate 101, the electrodes 102, 103 and the posts 105, 106 does not deposit any phase change material in these trenches 106, a spatially well-defined structure may be obtained which allows to have a phase change material only at desired portions. Thus, the convertible structure 104 may be formed without patterning phase change material, thereby allowing to apply a self-aligned procedure in which the material properties of the phase change material are not deteriorated by patterning effects.

Figure 2:
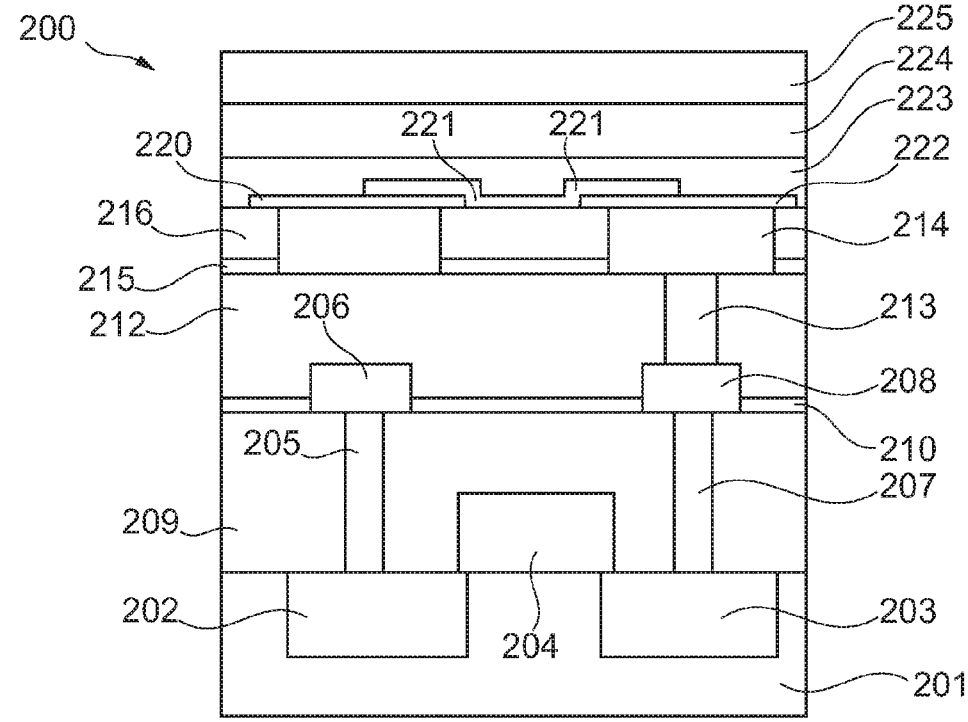
FIG. 2 illustrates a conventional phase change memory based on a line cell concept.

FIG. 2 shows a conventional implementation of a line cell 200.

However, the architecture particularly of the lower lying layers of FIG. 2 can be implemented in exemplary embodiments of the invention as well.

A first source/drain region 202 and a second source/drain region 203 are formed as doped regions in a semiconductor substrate 201. Furthermore, a gate region 204 of a corresponding switch transistor is shown as well. An electrically conductive connection structure 205 connects the first source/drain region 202 to a metal structure 206, whereas another electrically conductive structure 207 connects the second source/drain region 203 to a second metal structure 208. The metal structures 205 and 207 are embedded in a silicon oxide layer 209. A silicon carbide layer 210 is formed on the silicon oxide layer 209. Furthermore, a silicon oxide layer 212 is provided in which a metal contact 213 is formed electrically coupling the metal contact 208 with a metal contact 214. Above the silicon oxide layer 212, a silicon carbide layer 215 and a further silicon oxide layer 216 are formed. A first tantalum nitride layer 220 is an electric contact to a phase change material structure 221, which is in electrical contact with a second tantalum nitride layer 222. Above the phase change material structure 221, further electrically insulating layers 223, 224 and 225 are formed.

The phase change material structure 221 is formed by depositing phase change material on the layer sequence below, and by patterning the deposited layer.

Figure 3:
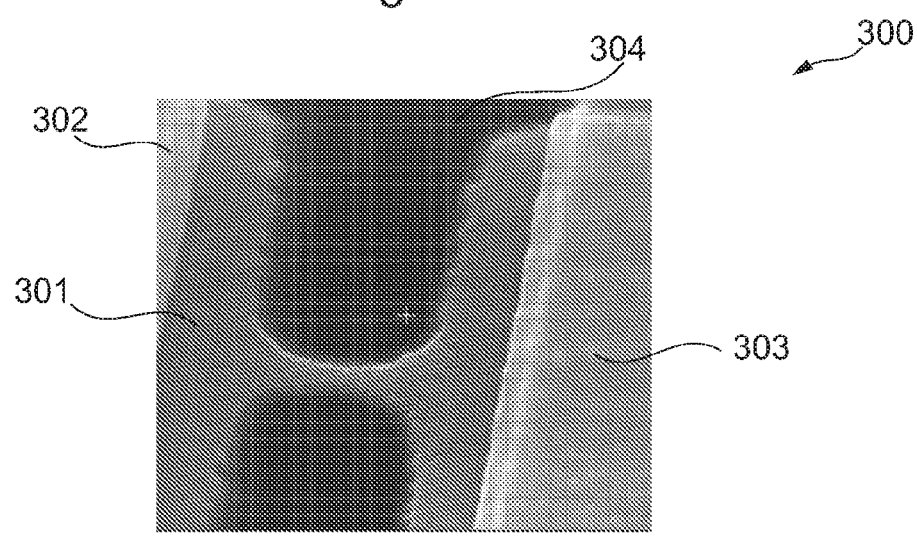
FIG. 3 is an image of a conventional phase change line after patterning by dry etching which shows that the phase change material is strongly attacked.

FIG. 3 shows an image 300 of a patterned phase change material structure 301 contacted by electrode structures 302, 303 (TaN electrodes). As can be taken from the image 300, the patterned phase change material structure 301 is strongly attacked by the manufacturing procedure. FIG. 3 further shows a field oxide region 304 made of silicon oxide ($SiO_2$). Alternatively, the electrically insulating region 304 may be made of silicon nitride or silicon carbide.

In the traditional line cell concept of FIG. 2 and FIG. 3, the active switching part of the phase change material 301 is patterned by lithography and subsequent reactive ion etching (RIE). The phase change material 301, which may be composed of Ge, In, Sn and Te, is extremely reactive towards the etch chemistry used during the patterning. Therefore, the patterning process has to be performed with great care. If this process is not well-tuned/controlled, the phase change material 301 can be, depending on the chemistry used, strongly attacked and/or depleted in one or more elements, leading to altered performances of the memory device (see FIG. 3).

In the following, referring to FIG. 4 to FIG. 8, a process for manufacturing a phase change memory cell 800 according to an exemplary embodiment of the invention will be explained.

In FIG. 4 to FIG. 8, a left column 410 illustrates a transparent top view, a central column 420 illustrates a top view, and a right column 430 illustrates a cross-sectional view of the respective layer sequences.

The process flow of FIG. 4 to FIG. 8 is capable of manufacturing a self-aligned phase change line cell on a free hanging dielectric bridge.

FIG. 4 shows a layer sequence 400 in which a first dielectric structure 403 is formed on a substrate (not shown). Below the first dielectric structure 403, monolithically integrated in the substrate, further components such as a switch transistor, electric lines, etc., may be provided (similar as in FIG. 2).

On the first dielectric layer 403, a second dielectric layer 404 is deposited and patterned to form trenches. In such trenches, two first metal structures 401 may be formed as a basis for a first electrode and a second electrode (Alternatively, on the first dielectric layer 403, two first metal structures 401 may be formed as a basis for a first electrode and a second electrode. In trenches between the two first metal structures 401, the second dielectric layer 404 may be deposited). On top of this layer sequence, a third dielectric layer 105 is deposited and patterned. Furthermore, second metal structures 402 may be formed to contact the lower lying metal structures 401.

The phase change memory cell may be formed in between the two electrodes 401, 402 in the BEOL (Back End Of the Line). They can be constituted by only one metal (not shown in the figures) or covered by another metal (see structures 401, 402 in FIG. 4) when there is incompatibility of the phase change material to be subsequently deposited in direct contact with the metal 401. The electrodes 401, 402 are formed in a dielectric stack composed of the three dielectric layers 403, 404, 105. The material of the dielectric structure 404 may be different from the material of the dielectric structures 403, 105 to ensure that it can be selectively etched towards the other layers.

In order to obtain the layer sequence 500 shown in FIG. 5, a line is defined in the third dielectric layer 105 linking the two electrode structures 401, 402. This is obtained by a subsequent photolithography and dry etching process selective towards the material of the second dielectric layer 404 and the metal structures 401, 402.

In order to obtain the layer sequence 600 shown in FIG. 6, a free hanging line is manufactured in the third dielectric layer 105, thereby forming the spacer element 105. During this procedure, a recess 601 is formed so that the free hanging spacer element 105 is generated by removing a portion of the second dielectric layer 404 by etching. Thus, once the line 105 is defined in the third dielectric layer 105, the second dielectric layer 404 is partially removed by an isotropic wet etching, selectively towards the first dielectric layer 403 and the metallic electrodes 401, 402. The isotropic etch may be long enough to leave a free hanging bridge of the third dielectric layer 105 linking the two electrodes 401, 402. It will later serve as a support for the self-aligned formation of the phase change material line.

In order to obtain the layer sequence 700 shown in FIG. 7, a phase change material is deposited on the surface of the layer sequence 600, thereby forming a phase change material structure 104 on the elevated bridge 105 serving as a template. Therefore, in order to manufacture the layer sequence 700, a self-aligned formation of the phase change material line 104 is carried out.

Using a physical vapour deposition system, the phase change material is sputter deposited over the entire wafer surface 600. The phase change line 104 will be formed on top of the hanging bridge 105 in the third dielectric layer 105. Due to the poor step coverage of this technique and the shape of the metallic electrodes 401, 402, no phase change material will be deposited at the side or at the bottom corner of the electrodes 401, 402. This will avoid shortcuts between the metallic electrodes 401, 402. It will therefore not be required to remove the phase change material in the field for device operation.

To ensure that the phase change material is not deposited at the edge of the electrodes 401, 402 neither at the bottom corner, the metal structure 402 may be designed to be larger than the metal structure 401. In case no electrodes 402 are implemented, shaping electrodes 401 such that the top width is larger than the bottom width may do this.

In order to obtain the phase change memory cell 800 shown in FIG. 8, the phase change material 104 may be covered by a dielectric structure 801 deposited at a low temperature (for instance 250° C.) to avoid deterioration of the phase change material 104 during further processing. By adjusting the deposition parameters, it is possible to fill properly the topography present on the wafer.

Figure 9:
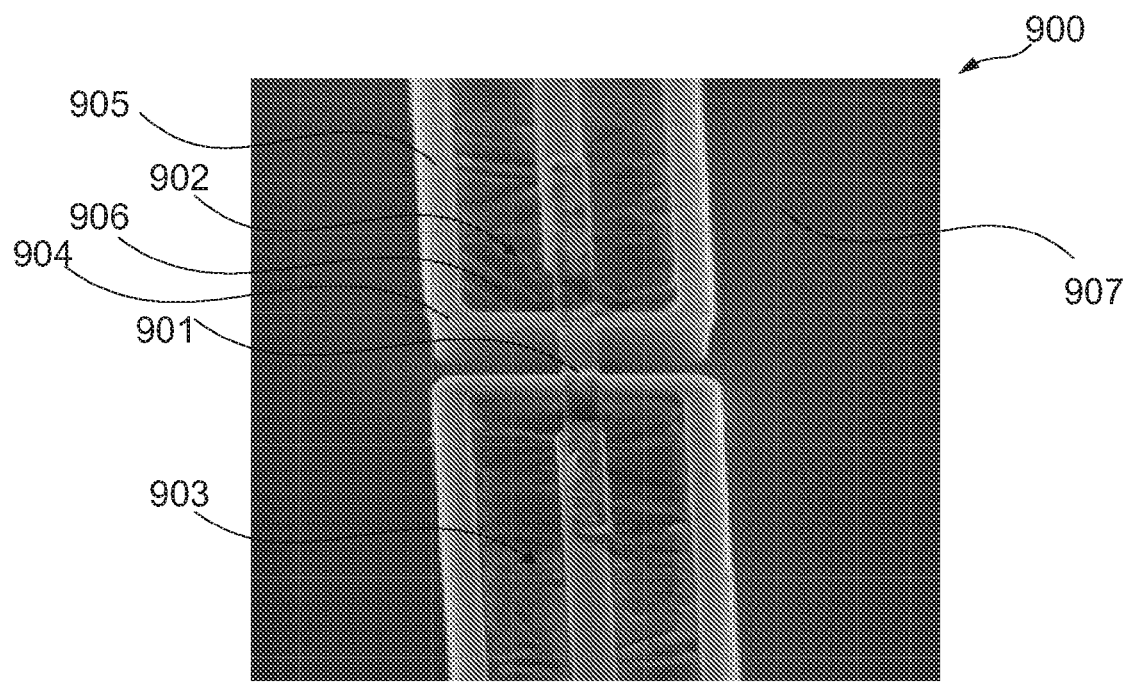
FIG. 9 is an image showing a free hanging dielectric bridge linking two metallic electrodes according to an exemplary embodiment of the invention.

FIG. 9 illustrates an image 900 in which a free hanging dielectric bridge 901 is shown linking two metal electrodes 902, 903. In more detail, the electrode 902, for instance, comprises a 400 nm copper electrode portion 904, a 50 nm TaN electrode stripe 905 on copper, and a further copper structure 906. Beyond this, a dielectric field structure 907 made of silicon carbide is shown.

In the following, referring to FIG. 10 to FIG. 15, a method of manufacturing a phase change line formed on a fine dielectric wall according to another exemplary embodiment of the invention will be explained.

As shown in FIG. 10, a layer sequence 1000 is produced in which electrode structures 401, 402 are formed on a dielectric layer 403 and embedded in dielectric material 404.

In order to obtain a layer sequence 1100 shown in FIG. 11, the dielectric layer 404 is etched to form a dielectric wall 1101 being spaced against auxiliary walls 1102 by two trenches 1103. In the described embodiment, the self-aligned phase change line will be formed on top of the fine dielectric wall 1101. The existence of very high aspect ratio trenches 1103 around this wall 1101 guarantee that no phase change material is deposited at the side walls and at the bottom of these trenches 1103.

In other words, in this embodiment, the self-aligned phase change memory is formed on top of a fine wall 1101 of the second dielectric material 404 linking the two electrodes 401, 402. The fine trenches 1103 will be patterned in between the electrodes 401, 402, with an aspect ratio (height/width) large enough (for instance larger than 8) to avoid phase change material deposition at the side walls and at the bottom of the trenches 1103. Due to the poor step coverage of the standard PECVD process, essentially no phase change material is deposited at the side walls of the trenches 1103, but only at the top of the dielectric lines. This is shown in FIG. 12

In order to obtain the layer sequence 1200 shown in FIG. 12, a phase change material layer 104 is deposited on top of the layer sequence 1100. After deposition of the phase change material 104, the phase change line cell may be defined by using a polymeric planarizing layer to flatten down the topography present on the wafer and subsequent lithography and dry etching steps.

Phase change material 104 on the surface of the dielectric layer 403 is removed, see layer sequence 1300 shown in FIG. 13.

In order to manufacture the phase change line memory cell 1400 shown in FIG. 14, a dielectric protection layer 1401 is deposited on the layer sequence 1300 at a low temperature (for instance 250° C.) to avoid deterioration of the phase change material 104 during further processing. By adjusting the deposition parameters, it is possible to fill the topography present on the wafer.

Figure 15:
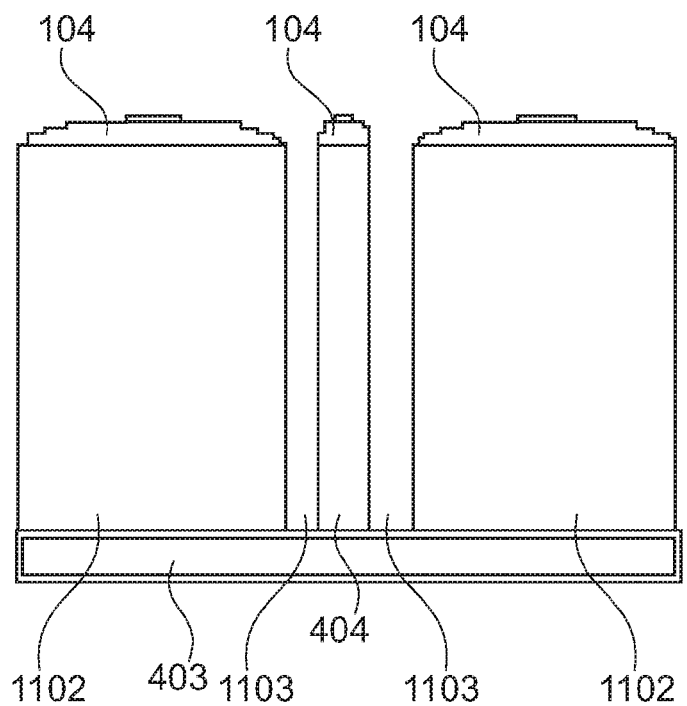
FIG. 15 is a cross-sectional view of a layer sequence obtained during the manufacture of an electronic device according to an exemplary embodiment of the invention.

FIG. 15 shows the topography of the narrow trenches 1103 according to an exemplary embodiment of the invention. Structure 404 is made of silicon oxide, structure 403 is made of silicon carbide, structures 1102 are made of silicon oxide, and structure 104 is made of a phase change material. It can be seen that thanks to the narrow trenches 1103, no phase change material 104 is deposited at the bottom of the trenches 1103, but only on top of the structures 1102 and 404.

Finally, it should be noted that the above-mentioned embodiments illustrate rather than limit the invention, and that those skilled in the art will be capable of designing many alternative embodiments without departing from the scope of the invention as defined by the appended claims. In the claims, any reference signs placed in parentheses shall not be construed as limiting the claims. The word "comprising" and "comprises", and the like, does not exclude the presence of elements or steps other than those listed in any claim or the specification as a whole. The singular reference of an element does not exclude the plural reference of such elements and vice-versa. In a device claim enumerating several means, several of these means may be embodied by one and the same item of software or hardware. The mere fact that certain measures are recited in mutually different dependent claims does not indicate that a combination of these measures cannot be used to advantage.

The invention claimed is:

1. An electronic device, the electronic device comprising a substrate;
a first electrode formed at least partially on the substrate;
a second electrode formed at least partially on the substrate;
a convertible structure connected between the first electrode and the second electrode;

a spacer element connected between the first electrode and the second electrode and adapted for spacing the convertible structure with regard to a surface of the substrate;

wherein a geometry of a surface area of the spacer element serves as an elevated structure on which the convertible structure is formed, and wherein, in a plan view on the surface of the substrate, an outline, such as a contour or a perimeter, of an arrangement formed by the spacer element, the first electrode and the second electrode are essentially equal to an outline of the convertible structure.

2. The electronic device according to claim 1, wherein the spacer element comprises a dielectric material.

3. The electronic device according to claim 1, wherein at least one of a group consisting of the first electrode and the second electrode consists of exactly one electrically conductive material.

4. The electronic device according to claim 1, wherein at least one of a group consisting of the first electrode and the second electrode comprises a first electrically conductive material in direct contact with the convertible structure and comprises a second electrically conductive material out of direct contact with the convertible structure.

5. The electronic device according to claim 1, comprising a support structure arranged between the substrate and the spacer element.

6. The electronic device according to claim 5, wherein the support structure and the spacer element comprise different materials.

7. The electronic device according to claim 5, wherein the support structure comprises a dielectric material.

8. The electronic device according to claim 1, comprising a protective structure covering at least the convertible structure.

9. The electronic device according to claim 1, wherein the spacer element is adapted as a template on which the convertible structure is formed.

10. The electronic device according to claim 1, wherein the convertible structure is a thermo-dependent structure, particularly a phase change structure that is convertible between at least two phase-states.

11. The electronic device according to claim 1, wherein the convertible structure is electrically conductive in at least one of at least two states.

12. The electronic device according to claim 1, comprising an electric sensing circuit adapted for sensing different electrical properties of the convertible structure in different ones of at least two states.

13. The electronic device according to claim 1, wherein the convertible structure is adapted such that a value of electrical conductivity differs between at least two states of the convertible structure.

14. The electronic device according to claim 1, wherein the convertible structure is adapted such that one of at least two states of the convertible structure relates to a crystalline phase and another one of the at least two states relates to an amorphous phase of the convertible structure.

15. The electronic device according to claim 1, adapted as one of the group consisting of a memory device, a memory array, an actuator, a microelectromechanical structure, a controller, and a switch.

16. A method of manufacturing an electronic device, the method comprising
forming a first electrode at least partially on a substrate;
forming a second electrode at least partially on the substrate;
connecting a convertible structure between the first electrode and the second electrode;
connecting a spacer element between the first electrode and the second electrode for spacing the convertible structure with regard to a surface of the substrate;
wherein a geometry of a surface area of the spacer element serves as an elevated structure on which the convertible structure is formed, and
wherein, in a plan view on the surface of the substrate, an outline, such as a contour or a perimeter, of an arrangement formed by the spacer element, the first electrode and the second electrode are essentially equal to an outline of the convertible structure.

17. The method according to claim 16, wherein the spacer element is formed to provide for a self-aligned connection of the convertible structure between the first electrode and the second electrode.

18. The method according to claim 16, wherein the convertible structure is formed without a patterning procedure.

19. The method according to claim 16, wherein the spacer element is formed as a free hanging bridge between the first electrode and the second electrode and above the substrate.

20. The method according to claim 16, wherein the spacer element is formed as a wall which bridges the first electrode and the second electrode above the substrate.

21. The method according to claim 20, comprising forming at least one auxiliary structure adjacent the spacer element such that a trench is formed between the at least one auxiliary structure and the spacer element.

22. The method according to claim 21, wherein the trench has an aspect ratio of at least 5, particularly of at least 8.

23. The method according to claim 16, wherein the electronic device is formed in CMOS technology.

24. The method according to claim 16, further comprising
forming a support structure on the substrate before forming the spacer element on the support structure;
at least partially removing the support structure before forming the convertible structure on the spacer element.

* * * * *